United States Patent
Wang et al.

(10) Patent No.: US 9,379,043 B1
(45) Date of Patent: Jun. 28, 2016

(54) TSV STRUCTURE HAVING INSULATING LAYERS WITH EMBEDDED VOIDS

(71) Applicant: POWERTECH TECHNOLOGY INC., Hsinchu (TW)

(72) Inventors: Ming-Yi Wang, Hsinchu (TW); Chao-Shun Chiu, Hsinchu (TW); Yen-Chu Chen, Hsinchu (TW)

(73) Assignee: POWERTECH TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/618,790

(22) Filed: Feb. 10, 2015

(51) Int. Cl.
| | |
|---|---|
| H01L 21/76 | (2006.01) |
| H01L 29/49 | (2006.01) |
| H01L 23/48 | (2006.01) |
| H01L 23/00 | (2006.01) |
| H01L 23/532 | (2006.01) |
| H01L 23/31 | (2006.01) |
| H01L 21/764 | (2006.01) |
| H01L 21/768 | (2006.01) |

(52) U.S. Cl.
CPC .......... *H01L 23/481* (2013.01); *H01L 23/3171* (2013.01); *H01L 23/5329* (2013.01); *H01L 24/13* (2013.01); *H01L 21/764* (2013.01); *H01L 21/7682* (2013.01); *H01L 29/4991* (2013.01); *H01L 2221/1047* (2013.01); *H01L 2224/13025* (2013.01)

(58) Field of Classification Search
CPC .............. H01L 21/764; H01L 21/7682; H01L 29/4991; H01L 2221/1047
See application file for complete search history.

(56) References Cited

U.S. PATENT DOCUMENTS

| | | | | |
|---|---|---|---|---|
| 6,878,600 | B2 * | 4/2005 | Birner ................. | H01L 27/1087 257/301 |
| 7,948,084 | B2 * | 5/2011 | Hsu .................... | H01L 21/02126 257/758 |
| 2003/0045069 | A1 * | 3/2003 | Gilgen ................... | H01L 28/91 438/396 |
| 2015/0340438 | A1 * | 11/2015 | Zhu ................... | H01L 29/78648 257/77 |

FOREIGN PATENT DOCUMENTS

KR    20100130697 A  * 12/2010  ........ H01L 21/02203

* cited by examiner

*Primary Examiner* — Ida M Soward
(74) *Attorney, Agent, or Firm* — Muncy, Geissler, Olds & Lowe, P.C.

(57) ABSTRACT

Disclosed is a TSV structure having insulating layers with embedded voids, including a chip layer, a dielectric liner and a conductive filler. There is at least a via reentrant from one surface of the semiconductor body of the chip layer. A plurality of air-gap cavities are formed on the sidewall of the via where the cavities have a depth-to-width ratio not less than one. The dielectric liner covers the sidewall of the via without filling into the air-gap cavities. The conductive filler is disposed in the via without filling into the air-gap cavities due to the isolation of the dielectric liner so as to form an air insulating layer with a plurality of enclosed voids embedded between the semiconductor body and the dielectric liner. Accordingly, RC Delay of the TSV structure can be improved.

10 Claims, 4 Drawing Sheets

TSV STRUCTURE HAVING INSULATING LAYERS WITH EMBEDDED VOIDS

FIELD OF THE INVENTION

The present invention relates to a vertical electrical interconnection of a semiconductor chip and more specifically to a TSV structure having insulating layers with embedded voids.

BACKGROUND OF THE INVENTION

In order to further shrink the dimension of a semiconductor electronic component, TSV (Through Silicon Via) has been implemented for vertical electrical interconnection inside a semiconductor chip. TSV comprises a conductive material to electrically connect the active surface to the back surface of a semiconductor chip so that the conventional bonding wires or ILB leads can be eliminated during vertically stacking chips to achieve semiconductor device miniaturization. However, as the miniaturization of TSV diameters and pitches, the impact of RC delay and charge coupling will become larger.

SUMMARY OF THE INVENTION

The main purpose of the present invention is to provide a TSV structure having insulating layers with embedded voids where a non-solid dielectric layer is disposed on the sidewall of TSV to improve RC delay of TSV to resolve signal time delay issues of conventional TSV structures.

According to the present invention, a TSV structure having insulating layers with embedded voids and the fabricating method is revealed, comprising a chip layer, a dielectric liner, and a conductive filler. There is at least a via reentrant from one surface of the semiconductor body of the chip layer. A plurality of air-gap cavities are formed in the sidewall of the via where each cavity has a depth not less than its width. The dielectric liner covers the sidewall of the cavity without filling into the air-gap cavities. The conductive filler is disposed in the via without filling into the air-gap cavities due to the isolation of the dielectric liner so as to form an air insulating layer including a plurality of enclosed voids embedded between the semiconductor body and the dielectric liner. A fabricating method to fabricate the TSV structure is also revealed.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
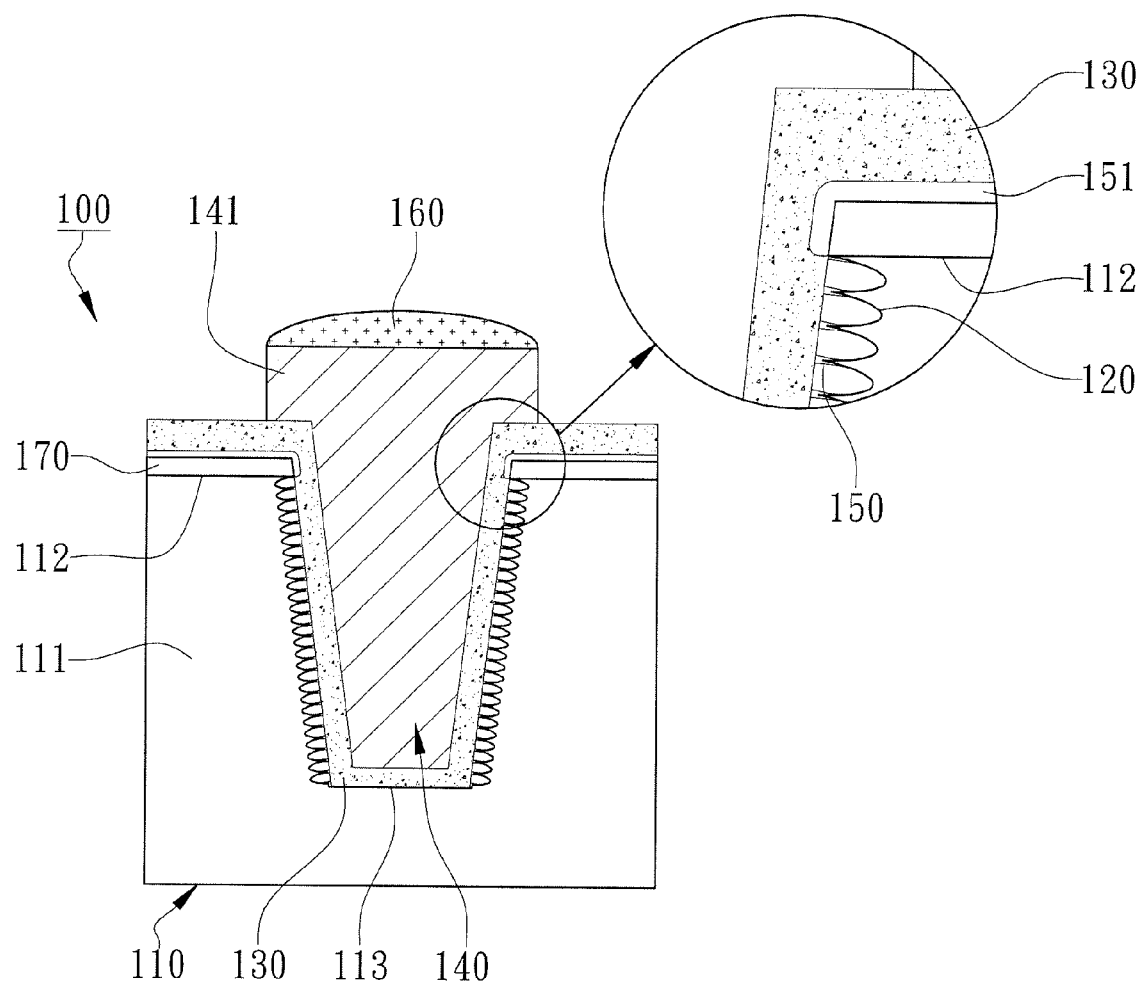
FIG. 1 is a partial cross-sectional view of a TSV structure having insulating layers with embedded voids according to the preferred embodiment of the present invention.

According to the preferred embodiment of the present invention, a TSV structure having insulating layers with embedded voids is illustrated in FIG. 1 for a partial cross-sectional view and from FIG. 2A to FIG. 2E for the partial cross-sectional views during its fabricating processes. The TSV structure 100 comprises a chip layer 110, a dielectric liner 130, and a conductive filler 140.

The chip layer 110 is a semiconductor component including integrated circuits. The chip layer 110 has a semiconductor body 111 such as Si (silicon) where the semiconductor body 111 has occupied more than 50 volume percentage of the chip layer 110. At least a via 113 is reentrant from a surface 112 of the semiconductor body 111 where the surface 112 can be the active surface or the back surface of the chip layer 110. When the surface 112 is the active surface, the depth of the via 113 might not exceed half of the thickness of the semiconductor body 111, then the via 113 can become a through hole through backside grinding processes. When the surface 112 is the back surface, the depth of the via 113 can be more than two-thirds of the thickness of the semiconductor body 111 or penetrating through the semiconductor body 111. A plurality of air-gap cavities 120 are formed on the sidewall of the via 113. As shown in FIG. 2D, each of the air-gap cavities 120 has a width W2 and a depth D2 where the depth D2 is not smaller than the width W2. To be more specific, the depth D2 of the air-gap cavities 120 ranges from one time to three times of the width W2 of the air-gap cavities 120 where the depth D2 of the air-gap cavities 120 ranges from 60 nm to 1500 nm and the width W2 of the air-gap cavities 120 from 20 nm to 500 nm. The depth D2 of the air-gap cavities 120 is normally greater than the IC circuitry thickness of the chip layer 110.

The dielectric liner 130 is disposed on the sidewall of the via 113 without filling into the air-gap cavities 120 where the material of the dielectric liner 130 can be chosen either from SiN, SiON, or $SiO_2$. The conductive filler 140 is disposed in the via 113 of the semiconductor body 111 where the materials of the conductive filler 140 can be copper or gold. Preferably, the conductive filler 140 is further extruded from the surface 112 of the semiconductor body 111 to form a bump 141 as an electrical contacting point. A soldering material 160 is disposed on top of the bump 141 such as Sn—Pb or Sn—Ag.

Furthermore, the conductive filler 140 does not fill into the air-gap cavities 120 due to the isolation of the dielectric liner 130 so that the air-gap cavities 120 are not filled either by the conductive materials nor by the solid dielectric materials to form an air insulating layer including a plurality of enclosed voids embedded between the semiconductor body 111 and the dielectric liner 130 which is formed by air trapped inside the air-gap cavities 120 and enclosed and covered by the dielectric liner 130 from the opening of the air-gap cavities 120. The thickness of the air insulating layer with embedded voids is defined by the depth D2 of the air-gap cavities 120 where the material inside the air-gap cavities 120 may contain air, i.e., the air-gap cavities 120 are not filled by the dielectric liner 130, to form a plurality of circular honeycomb porous structures.

Preferably, the TSV structure 100 further comprises a plurality of liner connecting rings 150 formed between the air-gap cavities 120 to physically connect to the dielectric liner 130 to avoid the liner connecting rings 150 to directly contact the semiconductor body 111 and to increase the depth of the air-gap cavities 120 without expanding the width of the air-gap cavities 120. The liner connecting rings 150 are not formed at the bottom of the air-gap cavities 120. The material of the liner connecting rings 150 can be the same of the material of the dielectric liner 130.

The dielectric liner 130 can be further formed on the surface 112 of the semiconductor body 111. The TSV structure 100 further comprises a passivation layer 170 formed on the surface 112 of the semiconductor body 111 and under the dielectric liner 130 where the passivation layer 170 is not formed inside the via 113 to be an anti-etching layer.

The definition of "Time constant" is resistance multiplied by capacitance. The capacitance of TSV structure 100 is the dielectric constant multiplied by TSV contact area divided by the dielectric thickness where the dielectric constant is one for air and four for oxide. The insulating layer with embedded voids formed by the air-gap cavities 120 has a lower capacitance so that the TSV structure 100 has a lower Time constant. Therefore, as revealed in the TSV structure 100 of the present invention, a non-solid dielectric material layer is created on the via sidewall of TSV to improve RC delay of TSV to resolve time delay issues of signal transmission of conventional TSV.

Figure 2A:
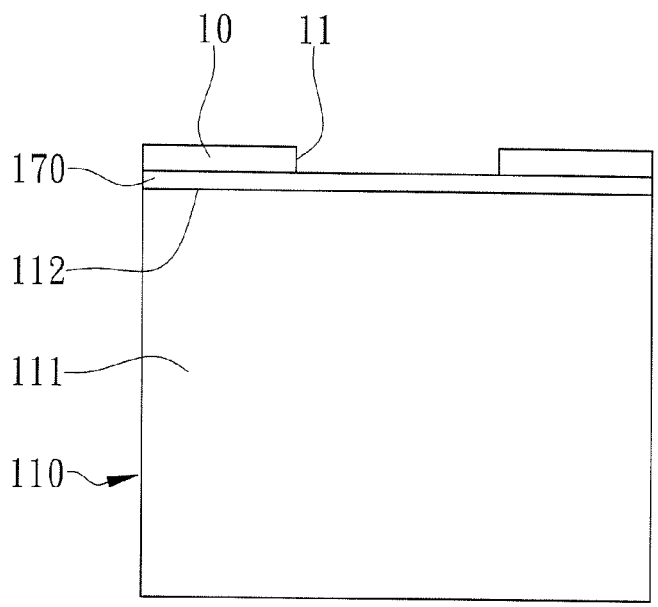
FIGS. 2A to 2E are partial cross-sectional views illustrating the fabricating processes of the TSV structure according to the preferred embodiment of the present invention.
Figure 2B:
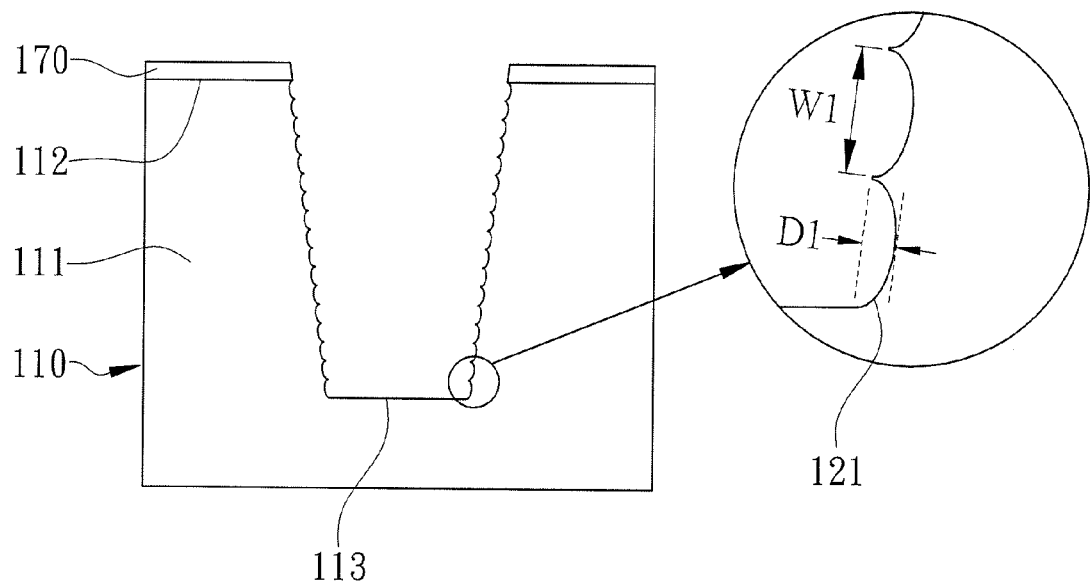
Figure 2C:
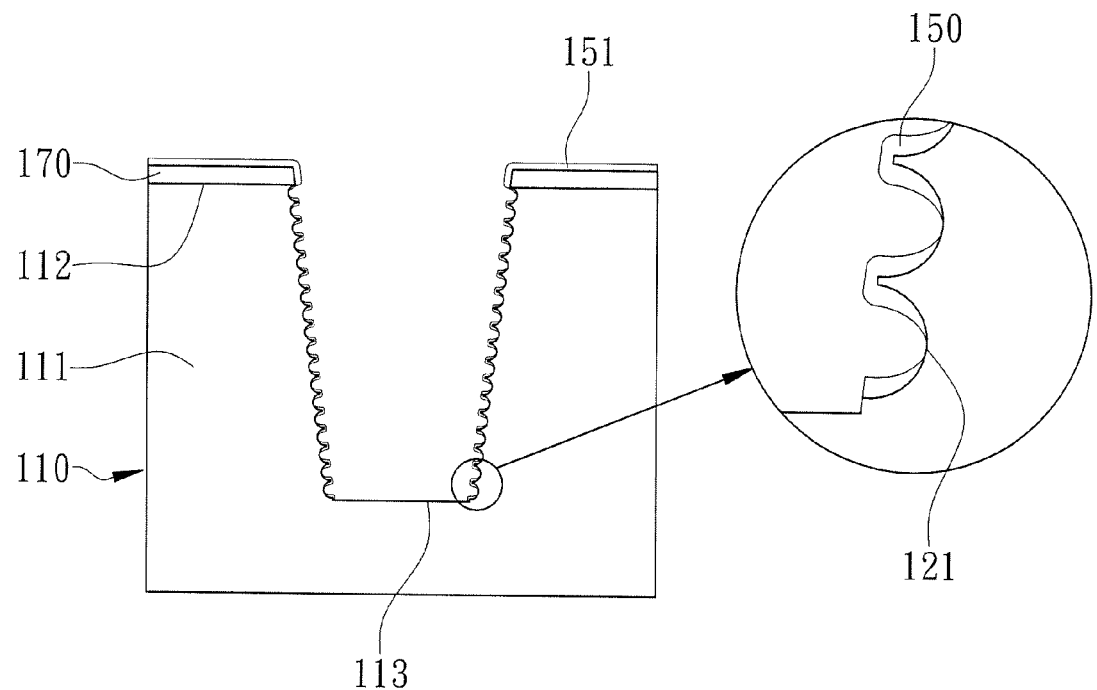
Figure 2D:
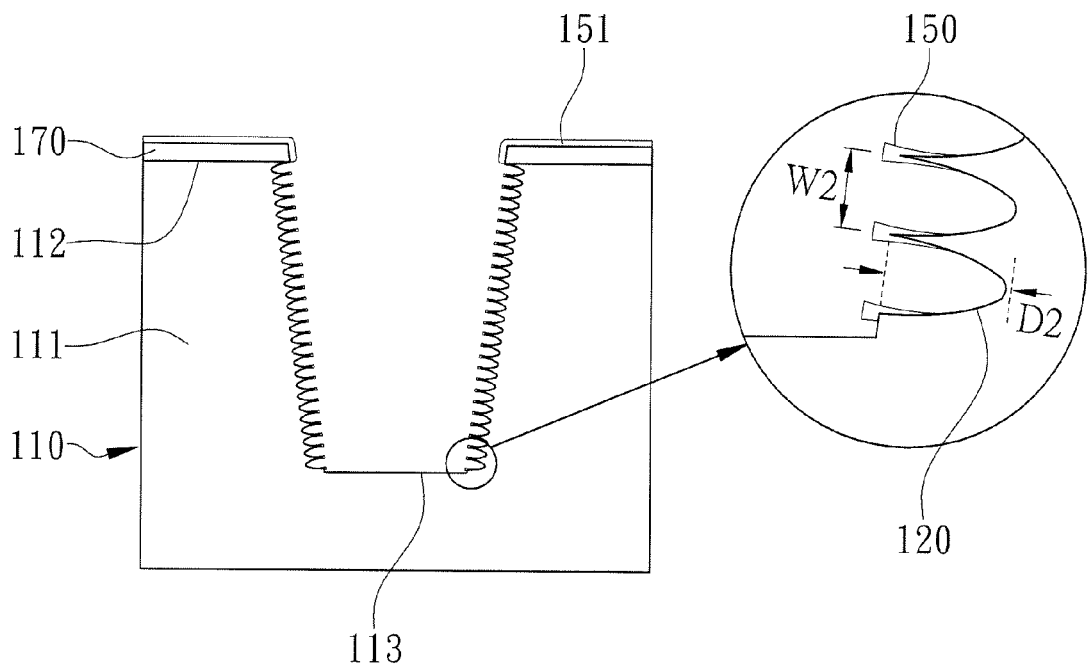

FIGS. 2A to 2E illustrate the fabricating processes of TSV structure 100. As shown in FIG. 2A, firstly, a chip layer 110 having a semiconductor body 111 is provided where the chip layer 110 is one of the chip units integrated in a wafer. A passivation layer 170 is disposed on one surface 112 of the semiconductor body 111 where an etching mask 10 is disposed on top of the passivation layer 170 such as photoresist materials. After photolithographic processes, an opening 11 is formed in the etching mask 10 corresponding to the location of the pre-designed TSV. As shown in FIG. 2B, via fabricating processes are proceeded where BOSCH deep RIE etching processes are implemented to form at least a via 113 where the via 113 is formed from and reentrant into the surface 112 of the semiconductor body 111. The via location is corresponding to the above mentioned opening 11. The etching mask 10 is stripped after the via 113 is fabricated. To be more specific, the via 113 fabricated has taper but not a vertical sidewall so that the length of the sidewall is greater than the vertical depth, i.e., the via 113 is a tapered blind hole having one opening larger than the bottom of the via 113 to enhance the depths of the above mentioned air-gap cavity 120. Moreover, as shown in FIG. 2B, a plurality of scallops 121 are formed on the sidewall of the via 113. The depth D1 of the scallops 121 is not greater than the width W1 where the depth D1 of the scallops 121 ranges from 20 nm to 500 nm and the width W1 from 20 nm to 500 nm.

Figure 2E:
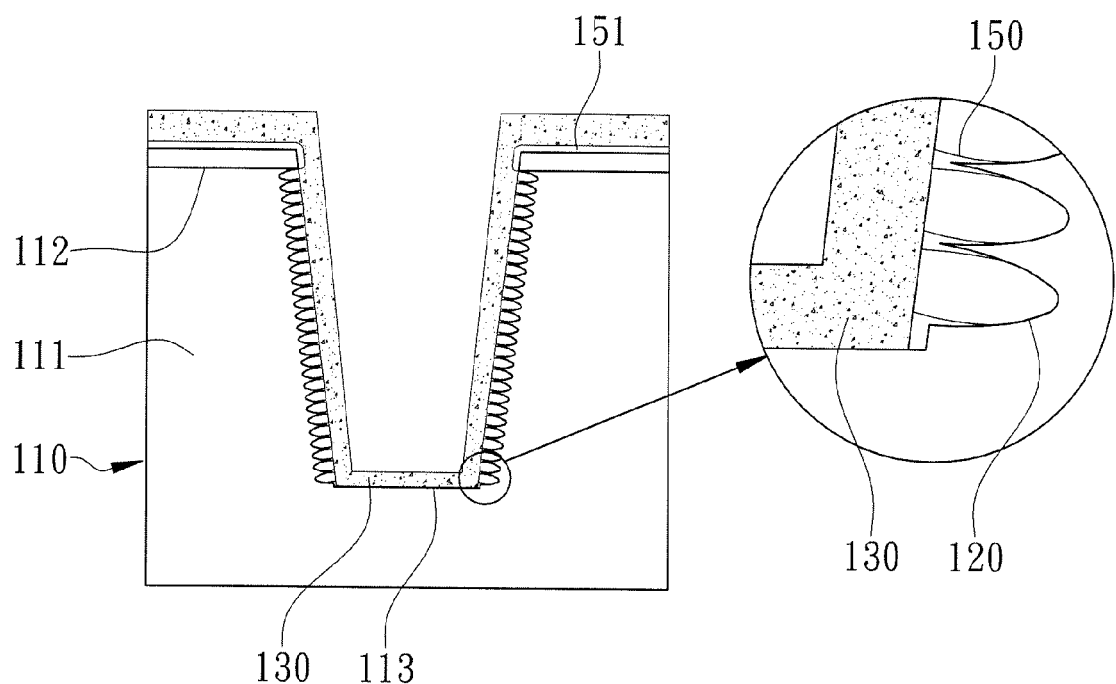

Then, a semiconductor micro-etching process is proceeded to form a plurality of air-gap cavities 120 on the sidewall of the via 113 where each air-gap cavity 120 has a width W2 and a depth D2 not less than the width W2 as shown in FIG. 2D. As shown in FIG. 2C, before semiconductor micro-etching processes, a liner connecting layer 151 is disposed on the surface 112 of the semiconductor body 111 by PE-CVD processes. At the same time a plurality of liner connecting rings 150 are formed on the sidewall of the via 113 between the scallops 121. The materials of the liner connecting layer 151 and the liner connecting ring 150 can be chosen from either SiN, SiON, or $SiO_2$. The deposition thicknesses of the liner connecting layer 151 and the liner connecting rings 150 range from 0.05 to 3 micro-meter. As shown in FIG. 2D, during the semiconductor micro-etching processes, BOSCH deep RIE etching processes or chemical etching processes are implemented, the unprotected portion of the sidewall of the via 113 are the scallops 121 which will further be etched to deepen the scallops 121 to form the air-gap cavities 120 so that the depth D2 of the air-gap cavities 120 can range between one time to three times of the width W2. As shown in FIG. 2E, the dielectric liner 130 is formed by a low step coverage PE-CVD processes so that the dielectric liner 130 covering the sidewall of the via 113 does not fill into the air-gap cavities 120 where the liner connecting rings 150 is physically connected to the dielectric liner 130. The dielectric liner 130 can be a single-layer or multiple-layer film. Preferably, the dielectric liner 130 consists of a low step coverage film as the bottom covering layer and a high step coverage film as the top covering layer. Finally, as shown in FIG. 1 again, a conductive filler 140 is disposed in the via 113 of the semiconductor body 111 by UBM deposition processes and electrical plating processes, however, the conductive filler 140 does not fill into the air-gap cavities 120 due to the isolation of the dielectric liner 130 so that the air in the air-gap cavities 120 are enclosed between the semiconductor body 111 and the dielectric liner 130 without filled by either the conductive materials or solid dielectric materials.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A TSV structure comprising:
   a chip layer having a semiconductor body, wherein at least a via is reentrant from one surface of the semiconductor body, wherein a plurality of air-gap cavities are formed on a sidewall of the via wherein each air-gap cavity has a width and a depth, wherein the depth is not less than the width;
   a dielectric liner covering the sidewall of the via without filling into the air-gap cavities;
   and
   a conductive filler disposed inside the via of the semiconductor body without filling into the air-gap cavities due to the isolation of the dielectric liner so that the air-gap cavities are not filled by either conductive materials or solid dielectric materials to fabricate an air insulating layer with a plurality of enclosed voids embedded between the semiconductor body and the dielectric liner.

2. The TSV structure as claimed in claim 1, further comprising a plurality of liner connecting rings formed between the air-gap cavities to physically connect to the dielectric liner.

3. The TSV structure as claimed in claim 2, wherein the liner connecting rings are not formed at a plurality of bottoms of the air-gap cavities.

4. The TSV structure as claimed in claim 3, wherein the depth of the air-gap cavities ranges from one time to three times of the width of the air-gap cavities.

5. The TSV structure as claimed in claim 1, wherein the depths of the air-gap cavities range from 60 nm to 1500 nm and the widths of the air-gap cavities ranges from 20 nm to 500 nm.

6. The TSV structure as claimed in claim 1, wherein the air-gap cavities contain air.

7. The TSV structure as claimed in claim 6, wherein the conductive filler further extrudes from the surface of the semiconductor body to form a bump.

8. The TSV structure as claimed in claim 7, further comprising a soldering material disposed on the bump.

9. The TSV structure as claimed in claim 6, wherein the dielectric liner further extending to the surface of the semiconductor body, wherein a passivation layer is formed on the surface of the semiconductor body and under the dielectric liner without formed inside the via.

10. The TSV structure as claimed in claim 1, wherein the via is a tapered blind hole having one opening larger than the bottom of the via.

* * * * *